(12) United States Patent
Moghaddam et al.

(10) Patent No.: US 7,108,056 B1
(45) Date of Patent: Sep. 19, 2006

(54) SLIT-TYPE RESTRICTOR FOR CONTROLLING FLOW DELIVERY TO ELECTROHYDRODYNAMIC THIN FILM EVAPORATOR

(75) Inventors: Saeed Moghaddam, Columbia, MD (US); Michael M. Ohadi, Clarksville, MD (US)

(73) Assignee: Atec Advanced Thermal and Environmental Concepts, College Park, MD (US)

( * ) Notice: Subject to any disclaimer, the term of this patent is extended or adjusted under 35 U.S.C. 154(b) by 234 days.

(21) Appl. No.: 10/685,630

(22) Filed: Oct. 15, 2003

Related U.S. Application Data

(60) Provisional application No. 60/419,690, filed on Oct. 18, 2002, provisional application No. 60/419,649, filed on Oct. 18, 2002.

(51) Int. Cl.
*F25B 29/00* (2006.01)
*F28D 15/00* (2006.01)

(52) U.S. Cl. .................. 165/201; 165/104.23; 417/50; 361/700

(58) Field of Classification Search ................ 165/201, 165/80.4, 104.23, 104.24, 104.33; 417/48, 417/50; 361/700
See application file for complete search history.

(56) References Cited

U.S. PATENT DOCUMENTS

| | | | | |
|---|---|---|---|---|
| 3,792,293 A | * | 2/1974 | Marks | 310/308 |
| 4,316,233 A | * | 2/1982 | Chato et al. | 361/233 |
| 5,635,039 A | * | 6/1997 | Cisar et al. | 204/252 |
| 6,149,810 A | * | 11/2000 | Gonzalez-Martin et al. | 210/321.84 |
| 6,374,909 B1 | * | 4/2002 | Jeter et al. | 165/104.23 |
| 6,418,019 B1 | * | 7/2002 | Snyder et al. | 361/700 |
| 6,443,704 B1 | * | 9/2002 | Darabi et al. | 417/50 |
| 6,655,450 B1 | * | 12/2003 | Nishio et al. | 165/104.23 |
| 6,888,721 B1 | * | 5/2005 | Moghaddam et al. | 165/80.4 |
| 6,981,849 B1 | * | 1/2006 | Kim et al. | 417/48 |

* cited by examiner

*Primary Examiner*—Ljiljana Ciric
(74) *Attorney, Agent, or Firm*—Daniel Kramer

(57) ABSTRACT

Cooling means for a heated surface comprising an enclosure for enclosing the heated surface and two oppositely charged interleaved radial arrays of microelectrodes positioned on the surface within the enclosure. The combined arrays have a closely spaced end and a periphery end. A volatile cooling liquid is contained in a reservoir within the enclosure but separate from the array. A slit-type restrictor is positioned between the reservoir and the array to restrict liquid flow from the reservoir toward the array. A portion of the closely spaced end of the array is positioned within the slit whereby the pumping action of the array draws only the amount of volatile liquid along the electrodes needed to form a thin evaporating film over the array area. The vapor from the thin film evaporator flows to a condenser where it is cooled, condensed to a liquid and returned to the liquid reservoir.

3 Claims, 4 Drawing Sheets

SECTION 1-1

SECTION 2B-2B

SECTION 1—1

SECTION 4A

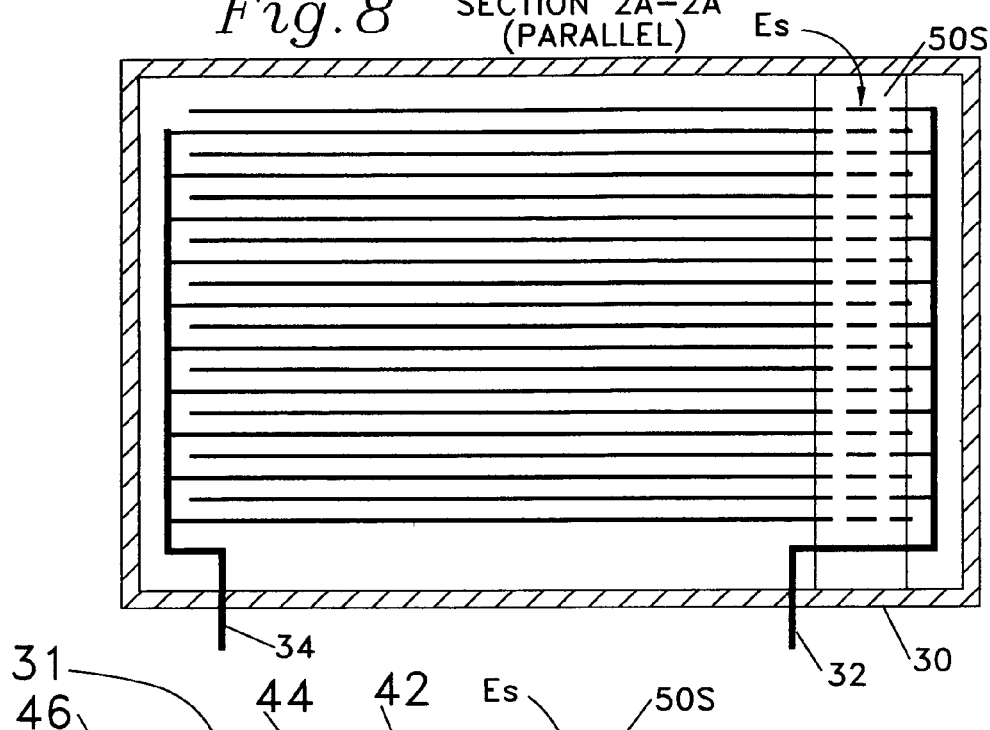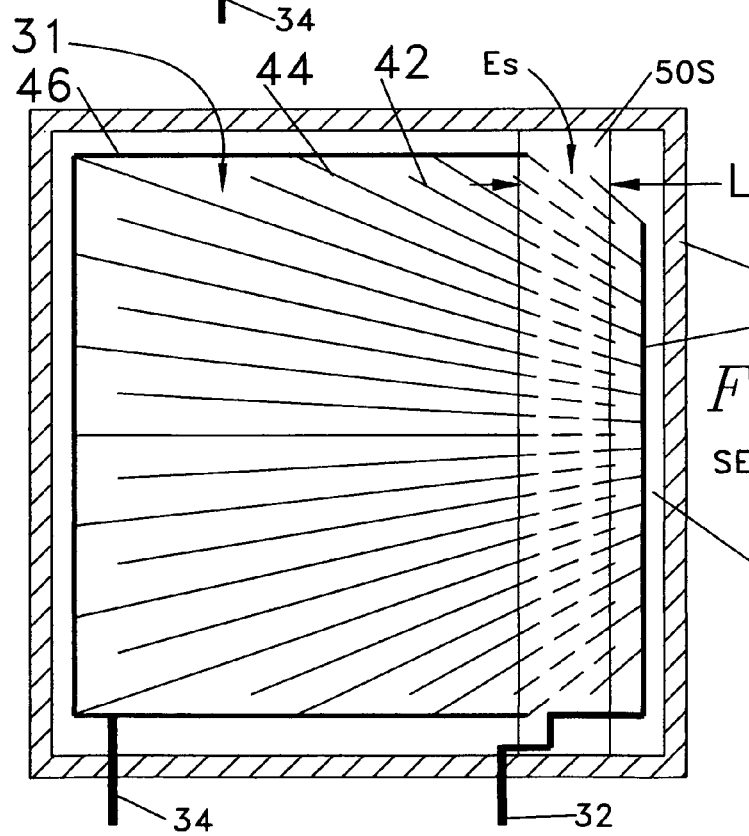

SECTION 2C-2C

SLIT-TYPE RESTRICTOR FOR CONTROLLING FLOW DELIVERY TO ELECTROHYDRODYNAMIC THIN FILM EVAPORATOR

PRIORITY CLAIMED

Priority is claimed based on the Provisional Patent Application filed 18 Oct. 2002 bearing Ser. No. 60/419,690 titled "Thin Film Evaporators Having Splayed Electrodes" and the Provisional Patent Application filed 18 Oct. 2002 bearing Ser. No. 60/419,649 and having the title, "Thin Film Micro-Evaporators with Slit-Type Restrictor"

GOVERNMENT SUPPORTED RESEARCH

No

BACKGROUND

Integrated circuits (IC) utilize micro-components such as transistors, capacitors and resistors that use and control electrical energy, frequently in digital form for controllers and computers. Larger macro sized solid state components are employed as power controllers such as switches, rectifiers, and alternators. Neither the micro nor the macro sized components or conductors are 100 percent efficient. Especially the micro-digital assemblies used in computers convert most of the electrical energy used in their computations into heat.

In the early versions of these integrated circuits having relatively few components per unit area, natural convection cooling proved adequate to limit the operating temperatures to safe values. As technology allowed packing more components into an integrated package the heat generated required motor driven fans mounted directly on the integrated circuit packages, thereby providing forced convection cooling, to control the package temperature. In order to accommodate higher and higher component densities and higher operating speeds requiring more and more power, more and more vigorous efforts have been made to remove heat effectively from the integrated circuit packages to keep the operating temperatures of the integrated circuit at safe levels.

These include more powerful fans, specialized venturis to direct the fan output onto the external surface of the integrated circuit package at higher velocities, plastic fins molded directly into the integrated circuit package and metal fins mounted on the package with heat conducting paste to better foster heat flow from the package to the fins to the fan forced air stream. All of these heat dissipation schemes have employed macro-cooling methods to cool micro components.

The increases in component density and accompanying heat dissipation rates have acted to raise operating temperatures of the IC packages to such levels that, with the best heat dissipating systems, their operating life can be endangered. To cope with this problem, temperature sensing thermistors have been placed in the micro-circuits to reduce their performance and thereby their heat dissipation and temperature under high ambient conditions or when the heat dissipating mechanisms lose efficacy, as when fouled with room dust. These mechanisms keep the computer operating but at reduced capability. This may be tolerable in household computing situations, but is intolerable in military or commercial systems where human lives and great fortunes can be endangered.

The current invention is directed to means for sharply improving the coefficients of heat transfer between the integrated circuit package and the coolant by improving the flow rate of cooling fluid dispersed over the IC package for evaporative cooling and to means for controlling cooling flow for temperature control.

PRIOR ART

U.S. Pat. No. 6,443,704 issued 3 Sep. 2002 describes a micro-array of substantially parallel electrodes applied to a hot surface for the purpose of moving a volatile cooling fluid along the electrodes. FIGS. 9 and 10 disclose one set of alternating electrodes formed with linearly varying width over the electrode length. The operation of the array relating to these figures is described at col. 6 lines 63–68 and col. 7 lines Ines 1–29. From the text it is clear that no slit or restrictor for restricting or limiting or controlling flow is shown or suggested. Further, Darabi not only teaches no means for allowing operation of the hot surface in horizontal or near horizontal positions but limits operation of his device to angles between vertical and 75 degrees off-vertical. (Col 6, lines 51–61) by contrast with the current invention which allows operation in any position.

OBJECTS AND ADVANTAGES

An object of the invention is to provide low cost, easily applied means for circulating, without moving parts, a volatile cooling fluid in heat transfer relation to a heated surface requiring cooling, whereby the liquid is evaporated.

A further object is to provide an array of interleaved micro-electrodes each having an electrical charge opposite the charge on its neighbors.

A further object is to position the array on the heated surface for the purpose of receiving liquid at a receiving or inlet end and moving the liquid from the receiving or inlet end over the length of the microelectrodes thereby covering the remainder of the array with a thin film of liquid, whereby the liquid in the film is evaporated over the area covered by the array, thereby cooling the heated surface.

A further object is to provide a reservoir of volatile liquid separate from the heated surface.

A further object is to provide a flow communication between the liquid reservoir and the array on the heated surface.

A further object is to provide that the flow communication is a slit-type flow restrictor for limiting liquid flow between the liquid reservoir and the array of microelectrodes on the heated surface.

A further object is to provide such a flow restrictor and array where a portion of inlet end of the array is positioned within the slit.

A further objective is to size the slit so that flow occurs only under the driving force of the electrically energized array partly positioned therein.

A further object is to position the receiving end of the array within the slit-restrictor A further objective is to provide an interleaved array having parallel electrodes.

A further object is to provide an interleaved array having electrodes positioned in a radial pattern.

A further is to provide such an array having electrodes more closely spaced at the receiving or inlet end and more widely spaced at the other or periphery end.

A further object is to position a portion of the array having the more closely spaced electrodes within the slit-type restrictor.

A further object is to provide a non-alternating electrical charge having opposite polarities on adjacent electrodes.

A further object is to provide such means that require unusually small amounts of electrical power.

A further object is to provide such means employing micro-electrodes that can be applied to the heated surface itself.

A further object is to provide such means having radially positioned electrodes.

A further object is to provide such electrodes having connected ends and free ends and where the free ends have a rounded shape.

A further object is to provide such means having an integral condenser for rejecting heat from the vapor to a coolant thereby condensing the vapor to a liquid.

A further object is to provide such means that utilize fluid polarization or dielectrophoresis principles for moving the liquid coolant along the length of the electrodes.

A further object is to provide such means that require only direct current energization and do not require single or multi-phase alternating currents for electrode energization.

A further object is to provide means for sensing a condition of the assembly and for electrically adjusting the flow in response to the value of the condition to control the condition.

A further object is to provide such control means where the voltage across the microelectrodes is increased to increase flow to the evaporator and decreased to reduce flow to the evaporator.

A further object is to provide such circulating or pumping means for a fluid that evaporates on contact with the surface being cooled.

A further object is to provide such circulating means that includes means for applying an electric field directly to the surface being cooled, thereby improving the heat transfer coefficient between the cooling fluid and the surface.

A further object is to provide an active thin film evaporation and cooling process.

A further object is to deploy the pumping means over the surface to be cooled.

A further object is to provide such circulating means to a surface positioned at any angle to the horizontal.

A further object is to employ a closed circulating system for the fluid circulated including a condenser for removing heat from the vapor produced by the evaporating process.

A still further object is to employ a volatile liquid as the fluid circulated and to deploy an externally cooled condenser to condense vapor generated at the cooled surface to the liquid state for reuse at the cooled surface.

A further object is to provide gravity circulating means for returning the condensed vapor to the surface.

A further object is to employ the principle of micro-electro-mechanical systems or MEMS to achieve the above objects.

Other equally important objects and objectives will be noted as the detailed exposition of the construction and usage of the invention is perused in the text below.

ADVANTAGES

The evaporator of this invention provides high heat transfer coefficients through the application of thin liquid film directly to the heated surface by depositing electrodes directly to the heated surface thereby allowing the direct liquid delivery to the heat transfer surface.

The use of cooling by evaporation allows higher heat transfer coefficients both at the cooled surface using the electrodes of the invention and at the condenser where the heat is rejected to a cooling fluid.

The provision of a slit type restrictor between a liquid reservoir and the heated surface prevents an excess flow of liquid over the heated surface that can reduce the heat transfer coefficient.

The positioning of the inlet portion of the electrodes within the slit itself allows the slit dimensions to be small enough to ensure that flow does not occur without the electromotive action of the electrodes.

BRIEF SUMMARY OF THE INVENTION

A micro-evaporator surface having a slit-type inlet for entry of a cooling volatile liquid and an exit for discharge of vapor or a mixture of liquid and vapor. The surface has positioned thereon an array of electrodes of substantially uniform width. The array has an inlet end and an outlet end. The array and the heated surface are positioned within an enclosure. A liquid reservoir is provided with a supply of volatile liquid coolant. The reservoir is connected to the portion of the enclosure containing the array positioned on the heated surface. A restrictor in the form of a slit is positioned to provide limited flow communication between the reservoir and the heated surface bearing the array. An inlet portion of the array is positioned within the slit. Energization of the array with alternate polarity electrical charges applied to adjacent electrodes causes the inlet portion of the array to draw liquid coolant from within the slit and distribute the liquid coolant in a thin film over the area covered by the micro array, thereby providing very high heat transfer coefficients for evaporation of the liquid coolant to a vapor. Condenser means are provided to receiving the vapor, condensing the vapor to a liquid and returning the liquid to the liquid reservoir.

BRIEF DESCRIPTION OF THE DRAWINGS

FIG. 7 (Section 2A—2A) shows the relative position of the flow restricting slit with respect to the electrodes of a radial array of microelectrodes.

FIG. 8 (Section 2A—2A) shows the relative relationship of the slit-type restrictor to the electrodes of a parallel array of microelectrodes.

DETAILED DESCRIPTION OF THE INVENTION

Technical Background

Figure 1:
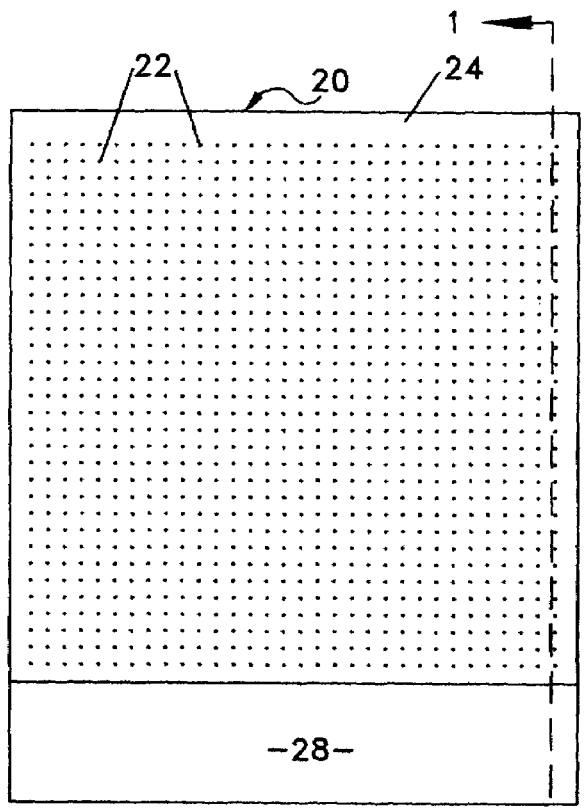
FIG. 1 is a front view of a heat producing integrated circuit with its many connection points.

Fabrication:

While a typical fabrication sequence is described, it is not intended that the described sequence be part of the invention and that any technology that applies microelectrodes will fulfill the requirements of the invention.

Typical fabrication begins with wafer or substrate pre-metalization cleaning. The substrate is typically quartz but sapphire or other similar material may be employed. After cleaning, 300 Å thickness Chromium and 2500 Å thickness Platinum (1 Å=10 E–10 m) is deposited using an e-beam evaporator. A 15,000 Å thick layer of photo resist is applied over the deposited metals followed by a soft bake at 100° C. Photolithography is employed to create the desired electrode pattern followed by a hard-bake at 120° C. While ion beam-milling can be employed, a variety of other etching techniques such as wet etching and deep reactive ion etching are available. Following the micro fabrication, the packaging is performed.

Cooling Fluid:

A cooling fluid suitable for use in this invention should be volatile and have low electrical conductivity. It should be highly subject to electrical polarization. It should have a saturated pressure at 100 C not far from atmospheric pressure in order to minimize costs of manufacturing an enclosure that would have to operate at higher pressures. Such a cooling fluid is a mixture of about 50 percent each of nonafluoroisobutylether and nonafluorobutylether. This fluid is offered by 3M Company located in St. Paul Minn. (1 800 364-3577) under the trade name HFE-7100 (liquid dielectric constant k=7.4). This fluid has a typical boiling point at atmospheric pressure of 60 C (~140 F) and a viscosity of 0.23 CPS at 23 C (73.4 F).

Among other useable fluids are those having low electrical conductivity and dielectric constants in the range of 2 to 100. Examples of these are deionized (DI) water (k=78.5), HFC-134a (k=9.5), L-13791 (k=7.39) and methoxynonafluorobutane ($C_4F_9OCH_3$).

Principles of Operation:

It is well known that thin film evaporation of a volatile liquid on a heated surface-to-be-cooled produces the highest heat transfer coefficients and therefore the most effective cooling of the surface. Therefore a basic principle of the invention is provision of means for reliably securing the desired thin film regardless of the orientation of the surface.

While the following principles are believed to be those responsible for the thin film distribution of the liquid over the area of the array, these principles are not the essence of the invention. It should be understood that it is the specific arrangement for metering the volatile liquid into the microelectrode array that is of the essence of the invention as described herein and as detailed in the claims.

The application of non-alternating direct current voltages to microelectrodes having alternate positive and negative polarities provides an electric field that causes polarization pumping of the high dielectric volatile cooling liquid along the lengths of the electrodes, thereby covering the area over which the microelectrodes extend. The microelectrodes can be parallel or positioned in a splayed or radial arrangement. The polarization effect causes the liquid to cover the microelectrode area with a film thickness of the order of a micron. It is this extremely thin liquid film that evaporates with the highest heat transfer coefficient between itself and the heated surface.

The thin liquid layer is delivered over the heat transfer surface covered by the electrodes using dielectrophoresis force. This force is generated through the use of non-uniform electric fields generated by the electrode arrangement. The thin liquid layer moves along the lengths of the microelectrode pairs by dielectrophoresis force action upon the liquid dipoles. The liquid dipoles can either be permanent or formed in the nonuniform electric field.

A second force, electrostriction force, acts on the liquid-vapor interface thereby both holding the liquid securely against and in the immediate vicinity of the electrodes and resisting the dielectrophoresis forces. It is believed that these forces acting together produce both the liquid flow and the very thin film over the microelectrode area.

The electrical potential needed to cause polarization of a preferred fluid depends, in part on the nature of the fluid and in part on the form and separation distance of the microelectrodes. While the breakdown potential for the vapor of the cooling fluid may be in the region of 1 kV/mm the very small electrode spacing requires an actual voltage in the range of 50 to 200 V. While a uniform, substantially non-varying DC voltage performs well, it is within the scope of this disclosure that the voltage may be caused to vary while maintaining the same relative polarity between the electrodes. The voltage variation may be in the form of an impressed sine wave, a square wave or some other format. Further, a variation having a defined frequency such as 20 Hertz (Hz) or 60 Hz or a much higher frequency such as 1000 Hz may be preferred. The voltage may also be varied in response to an external stimulus such as the outlet condition of vapor from the evaporator or the actual temperature of the surface to be cooled or the actual temperature of heat generating device itself.

DETAILED DESCRIPTION OF THE DRAWINGS

Figure 2:
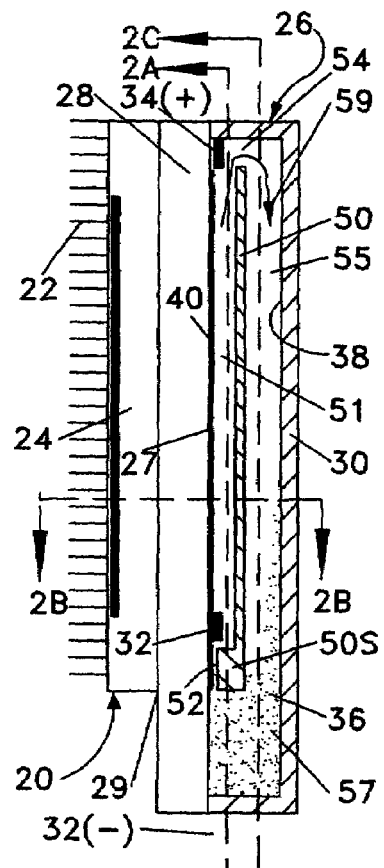
FIG. 2 is a side elevation of the device of FIG. 1 showing a crossection of the heat producing integrated circuit assembly and the cooling device of the invention mounted in heat transfer relation to the integrated circuit assembly, with a baffle mounted to direct vapor flow.
Figure 4:
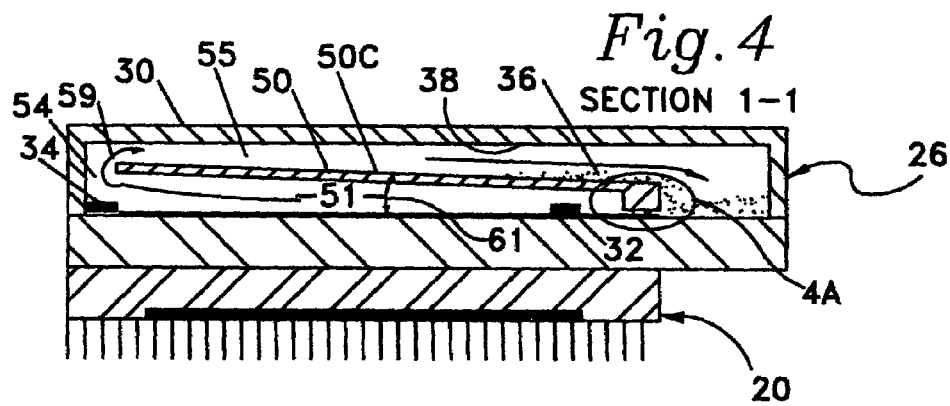
FIG. 4 is a crossection of the cooling assembly of the invention having an integral condenser and having a flow directing baffle positioned to facilitate return flow of condensed liquid to the reservoir during operating of the device in a horizontal position.

FIG. 1 is a front elevation of an Integrated Circuit assembly (IC) in package 20 formed in an enclosure 24 and having a multiplicity of electrically connecting pins 22 for providing power and information to the IC from a computer connected socket and for withdrawing from the IC information processed by it. In the process of performing its information or power processing function, heat is generated by the IC sealed within the enclosure 24. It is this heat that the cooling device of the invention is intended to efficiently remove. FIG. 1 displays sectioning lines 1—1 to indicate a side elevation. Since there are two embodiments of the construction, one is shown in FIG. 2, labeled section 1—1; the other is shown in FIG. 4, also labeled section 1—1. While the term 'elevation' is employed to describe the orientation of this or other sections, the term elevation is not intended to suggest any particular physical position of the unit with respect to the horizontal.

Referring now to FIG. 2, which is section 1—1 of FIG. 1, we see the cooling system assembly 26 of the invention thermally connected to the outer hot surface 40 of the IC package 20 on the package side opposite its pins 22.

Typically the thermal connection is made by coating the surfaces to be thermally connected with a heat conducting grease and clamping or otherwise securing together (clamping means not shown) the IC 20 to be cooled and the cooling device 26, thereby forming a mechanical and thermal interface 29.

While the cooling unit 26 has a silicon substrate 28, other materials may be employed for substrates including other ceramics and single crystal quartz. The primary substrate requirements are low electrical conductivity, rigidity and high thermal conductivity. Surface 27 of the substrate 28 of the cooling unit 26 is now the heated surface because of its thermal coupling with the IC package 20. On heated surface 27 is positioned microelectrode array 31. Array 31 comprises a multiplicity of substantially linear microelectrodes 42 and 44 each having an opposite electrical charge from its neighbors. While the electrodes 42, 44 in the electrode array are described and shown as being straight, they can also be positioned on a curved or cylindrical surface and the description should be understood to apply to each surface to which such an array could be applied whether flat, curved, cylindrical, convex or concave and whether the electrode pattern is parallel, splayed or some other pattern. The positively charged microelectrodes 44 are connected together in parallel by conductor 46 and supplied with their charge from external connector 34 connected to 46. In like fashion the alternately positioned negatively charged microelectrodes 42 are connected together by conductor 48 that is supplied with its negative voltage by external connector 32. The points where the external connectors traverse the enclosure 32, of course, are sealed to prevent escape of cooling fluid or entry of contaminants.

An enclosure 30 is provided for containing and for channeling cooling liquid 36 over the microelectrodes. The enclosure 30 is bonded or otherwise sealed to the substrate 28. Within enclosure 30 is positioned baffle 50 substantially coextensive with the area covered by the electrodes. While baffle 50 is shown substantially parallel with the surface 27 on which the micro electrodes are positioned, other baffle orientations are possible and one alternate orientation is shown and described in connection with FIG. 4. One end of the baffle is enlarged to form a planar portion 50S one side of which is closely spaced from the surface 27 on which the microelectrodes are positioned, thereby forming a slit-like opening 52 through which there is restricted flow of volatile liquid 36. While slit 52 is shown formed by an enlargement of baffle 50 it may be constructed in any suitable and convenient way, so long as the inlet portion of array 31 is positioned within the slit. The slit gap or distance DS of the extended baffle surface 50S from the surface 27 of substrate 28 or microelectrode array 31 is generally between 10 and 150 microns depending on the viscosity and electrical characteristics of the liquid 36 used as volatile coolant. In the case of HFE-7100, a gap of 40 microns has been successful.

An essential feature of the invention shown in FIG. 2, but shown more clearly in FIGS. 4 through 9, is the positioning of gap 52 such that it overlays and includes an inlet portion of the microelectrode array 31 comprising alternating positive and negatively charged electrodes 42 and 44. The gap must be selected by trial with the particular liquid and unit orientation employed such that the capillary forces prevent free flow of liquid through the slit 52 when there is no electrical charge applied to the microelectrodes. Then, when the proper non-alternating DC charges of opposite polarity are applied to adjacent microelectrodes, the polarization or electrophoresis forces generate the required flow by withdrawing liquid 36 from between the faces of slit 52 and distributing that liquid in a thin film over the microelectrode areas.

Figure 6:
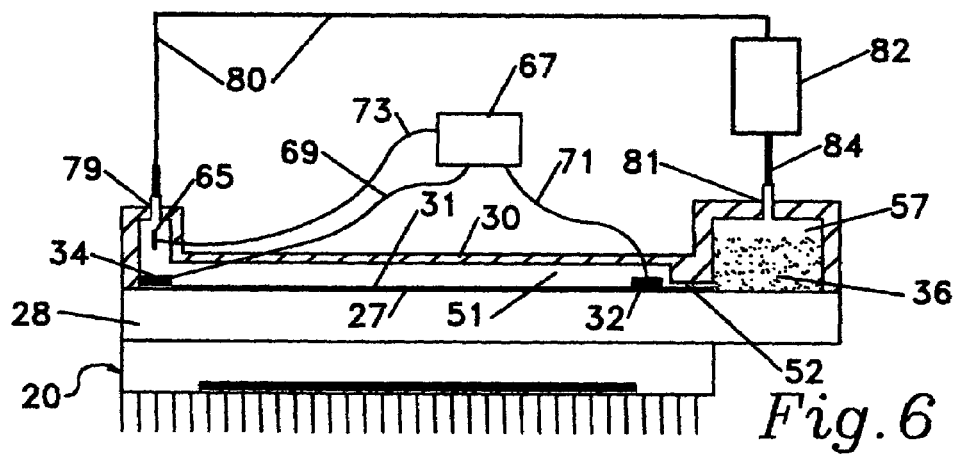
FIG. 6 shows an embodiment of the invention where the condensing surface is external of the enclosure and a condition sensor is positioned to sense outlet conditions from the evaporator and is connected to affect the voltage applied to the electrodes.

The vapor 59 resulting from the evaporation of the liquid over the microelectrode area flows from the evaporator volume 51 in a vapor stream through the baffle end clearance 54 to condensing volume 55. There the vapor 59 is exposed to cool external surface 38 where the vapor condenses to a liquid 36. The liquid 36 flows by gravity into reservoir 57 forming a pool of liquid 36. The reservoir is positioned to supply liquid to slit 52 from which the liquid 36 flows into evaporator section 51 as a thin film. The flow of liquid 36 through the slit 52 is under control of the voltage applied to the alternating positive and negatively charged microelectrodes 42 and 44 (FIG. 6).

Figure 9:
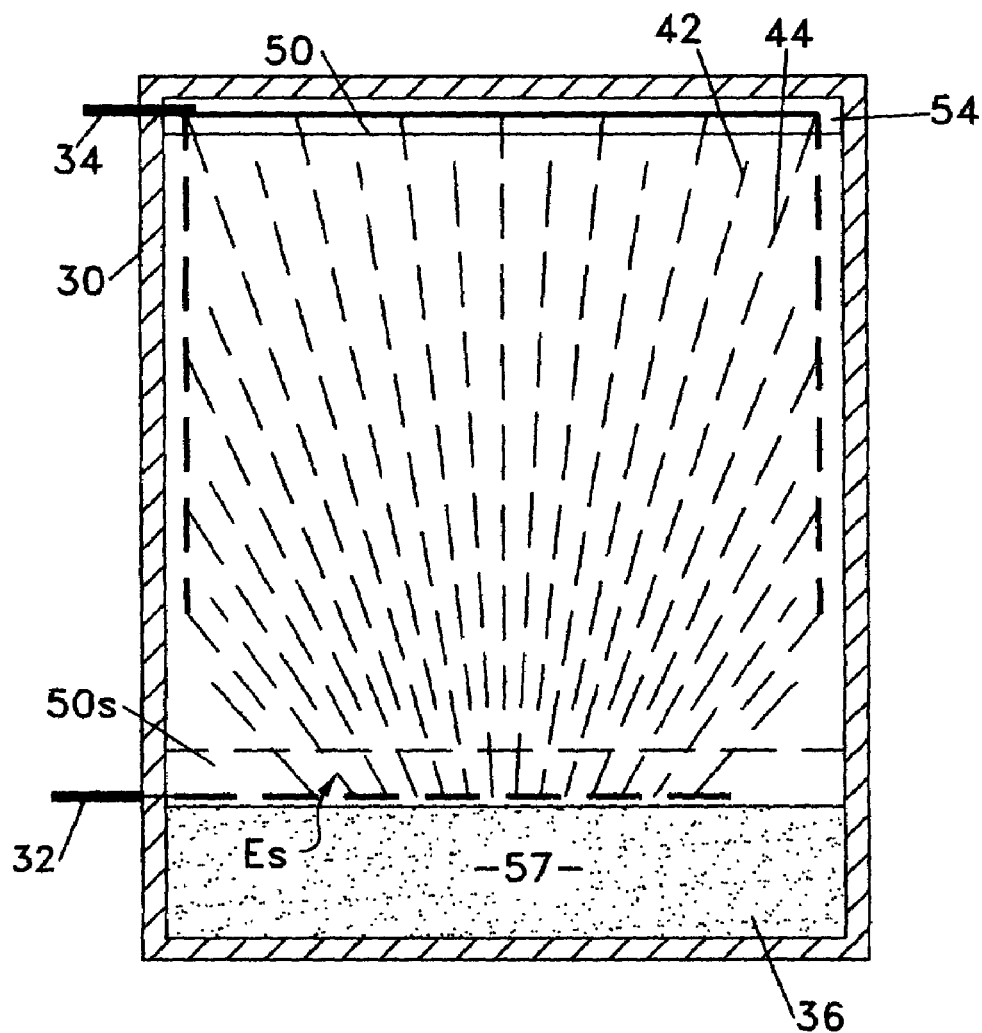
FIG. 9 (Section 2C—2C) shows the relation of both the slit-type restrictor and the flow directing baffles with respect to an array of microelectrodes.

FIG. 2 displays three section lines: Section line 2A—2A, shown in FIG. 7, is parallel to the microelectrode surface and cuts through baffle section 50S but not the baffle 50 itself. Section 2C—2C, shown in FIG. 9, is parallel to the microelectrode surface but does not cut any part of the baffle 50 or 50S. Section 2B—2B, shown in FIG. 3, looks from the central part of FIG. 2 toward the slit 52.

Figure 3:
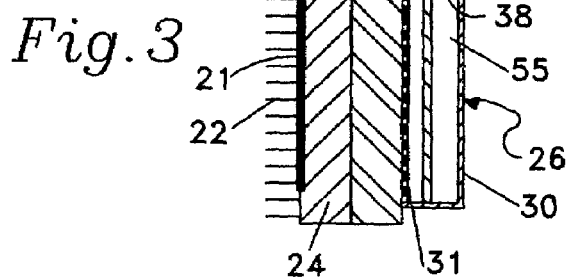
FIG. 3 is a crossection of FIG. 2 showing the relationship of the components.

Referring now to FIG. 3 which is the section 2B—2B of FIG. 2 and may be considered either a top view or an end view, there is again shown the integrated circuit 20 unit containing heat generating IC 21 with its connection pins 22. It is the IC that generates the heat to be removed by the device 26 of the invention. The IC is mounted on substrate 24 which presents its hot face 40 to be cooled. The cooling package 26 has its substrate 28 mounted in heat transfer relation to the hot face 40 of the IC package, thereby forming the heat exchange interface 29. The microelectrode array 31 of the invention are mounted on substrate 28. An enclosure 30 is provided to contain the cooling fluid. Within the container is mounted baffle 50 to guide the flow of vapor 59 from the evaporating volume 51 where it is formed, to the condensing volume 55 where it is exposed to cooled condensing surface 38 that condenses the vapor to liquid for recycling through the process.

Referring now to FIG. 4, there is shown again section 1—1 from FIG. 1. In this embodiment of the invention the IC and its face 40 to be cooled are intentionally shown in a horizontal position. In this figure the elements are substantially the same as shown in FIG. 2 with the exception that the condenser side face of baffle 50 has been pitched at an angle 61 from the plane of the array to provide for gravity flow of liquid condensed by condensing surface 38. In this embodiment vapor formed in evaporating volume 51 flows to condensing volume 55 where it is exposed to cool surface 38 and condenses flowing down the inclined surface 50C of baffle or directing means 50, back to reservoir 57, thereby forming a pool of liquid 36 for recycling through the cooling process.

While the entire baffle 50 is shown pitched to provide the drainage angle, in other embodiments the baffle side 50E facing the evaporator volume may be horizontal to provide uniform spacing from the microelectrodes and only the upper baffle surface 50C facing the condenser volume is pitched, thereby forming a wedge-shaped baffle that is not shown.

Figure 5:
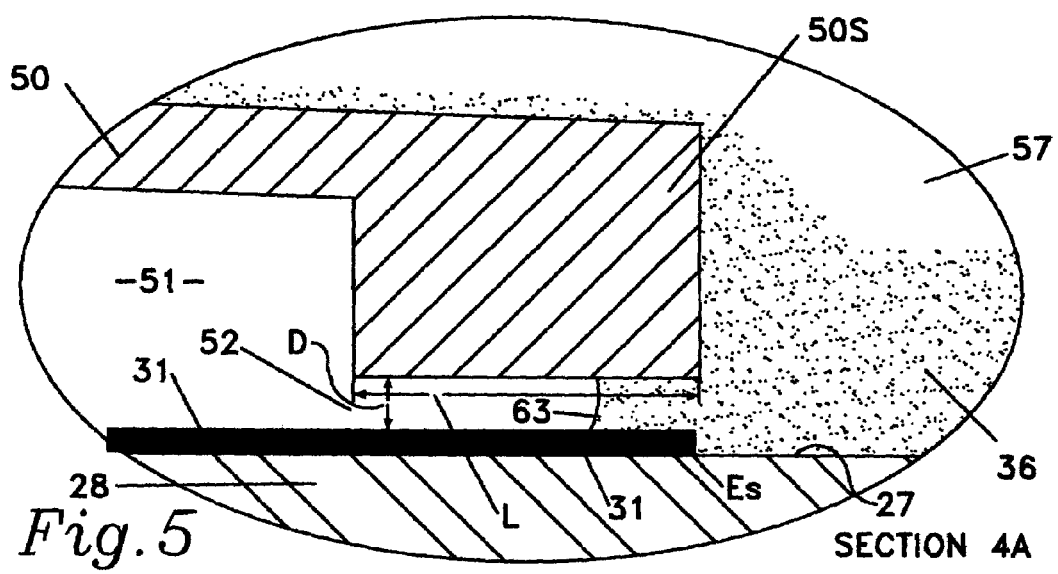
FIG. 5 (Section 4A) is a very much enlarged view of the flow restricting slit and its relation to the first end of the array.

FIG. 5 is a greatly enlarged section 4A shown in FIG. 4. There, one end of baffle 50 is shown with its enlarged portion 50S. The enlarged portion forms slit gap 52 having a spacing dimension from surface 27 of substrate 28 in the range of 10 to 150 microns, depending on the orientation of the structure and the nature and viscosity of the fluid. The length L of the slit is typically about 10 percent of the overall dimension of the array measured in the direction of flow. Reservoir 57 is shown partly filled with liquid 36 and, with no electrical charge applied, the meniscus 63 is positioned within the slit, indicating that, with no electrical potential applied, little to no flow occurs. The portion of the array of microelectrodes Es lies within the slit, enabling the array to pump liquid out of reservoir 57 into the evaporating zone 51 covered by the array of microelectrodes when it is electrically energized. The portion of the array laying within the slit is defined as "the inlet end," even if that portion of the array is midway between its two ends, because that portion is the "inlet portion" that induces and meters flow to the evaporating zone.

Referring now to FIG. 6, there is shown the heat producing IC assembly 20 with an attached cooling assembly 26R provided with remote condenser 82. The cooling assembly 26R has enclosure 30 and substrate 28 positioned in heat transfer relationship to the IC 20. Positioned on surface 27 of substrate 28 is an array of microelectrodes 31 having positive connection 34 and negative connection 32. The array 31 extends into slit-type restrictor 52 thereby enabling flow when the array 31 is energized, the slit 52 having been sized to prevent flow when not energized. Reservoir 57 is partly filled with liquid 36, ready to be pumped to the evaporator surface covered by microelectrodes 31.

The liquid delivered to heated surface 27 by the array 31 is evaporated to a vapor 59 which flows to remote condenser 82 via vapor outlet 79 and conduit 80. Liquid 36 generated in condenser 82 by condensation of vapor 59 flows back to reservoir 57 via condenser outlet conduit 84 and liquid inlet 81. The liquid 36 accumulates as a liquid pool in said reservoir.

Within vapor outlet 79 is sensor 65 having communication to power supply 67 via conduit 73. Conduit 73 is an electrical conductor when the sensor is a temperature sensor or a capillary tube where the sensor is s pressure sensor. However, the exact ways that the sensor communicates with the power supply is not of the essence. The sensor may also be clamped or otherwise thermally or pressure connected to sense conditions of vapor 59. Sensor 65 is a temperature sensor. In other applications sensor 65 is a superheat sensor and in still others sensor 65 is a pressure sensor. The purpose of the sensor is to supply information to electrical power supply 67 upon which power supply 67 will increase or decrease the voltage applied to connections 32 and 34 of the array 31 via its conductors 69 and 71.

One objective of the sensor is to sense the presence of a greater quantity of liquid than can be evaporated by the available heat input responding thereby reducing the voltage applied to the connections 32, 34. Another objective is to protect the enclosure from excessive internal pressure that can arise on failure of the condenser cooling arrangement.

While the feedback control for the array power supply is shown in connection with FIG. 6, it must be understood that the feedback arrangement to control the voltage applied to the array is applicable to all shown constructions. In this construction, the flow of liquid over the microelectrode array and therefore the cooling effect generated is totally under electrical control. Such control can provide improved performance and prevent IC damage under unexpected circumstances.

FIGS. 7 and 8 (both section 2A—2A) are provided to illustrate that the arrangement of the microelectrodes in the array 31 used in conjunction with the slit-type restrictor of the invention can have a number or patterns. FIG. 7 shows array 31 having a radial or splayed pattern. FIG. 8 shows array 31 having a parallel pattern. Other configurations are possible. Examination of FIG. 2, the source of the section, shows that the section line traverses only portion 50S of baffle 50. The microelectrodes within the slit area are hidden (dashed) and designated as Es. Reservoir 57 is shown on both, positioned to supply liquid to the slit. In both the array of FIG. 7 and the array of FIG. 8 there is shown external voltage connections 32 and 34; negative connectors 48 supplying potential to microelectrodes 42 connected to connection 32 and positive connectors 46 connected to external connection 34 and supplying potential to microelectrodes 44.

FIG. 9 is section 2C—2C where the section line is positioned between baffle 50 and the enclosure 30. There the liquid 36 residing within reservoir 57 can be seen along with the end of baffle 50 and the vapor flow passage 54.

While all embodiments of the invention have presented the advanced flow control construction in the context of evaporator as heat receiver and condenser as heat dissipator, the essence of the invention is the ability of the advanced construction taught herein to control flow and other applications utilizing these concepts are intended to be covered and included within the thrust and spirit of the appended claims.

From the foregoing description, it can be seen that the present invention comprises an advanced method for cooling integrated and other compact heat producing devices by controlling flow of the cooling medium to an evaporator. It will be appreciated by those skilled in the art that changes could be made to the embodiments described in the foregoing description without departing from the broad inventive concept thereof. It is understood, therefore, that this invention is not limited to the particular embodiment or embodiments disclosed, but is intended to cover all modifications and elements thereof and their equivalents which are within the scope and spirit of the invention as described above and claimed.

We claim:

1. Means for cooling a heated surface comprising: an enclosure; an array of microelectrodes positioned on said heated surface, said array including means for accepting electrical charges of opposite polarities on adjacent microelectrodes, said array having a first end and a second end; a volatile liquid; a reservoir for receiving, holding and dispensing said volatile liquid; flow restricting means in the form of a slit formed between two substantially parallel surfaces for allowing limited flow between said reservoir and said array first end, one of said substantially parallel surfaces having positioned thereon a portion of the first end of said array whereby liquid is delivered to and distributed over the heated surface by the array and evaporated to a vapor thereby cooling said heated surface; condensing means for receiving and condensing to a liquid any vapor formed by the evaporation of said liquid on the heated surface; at least one baffle substantially coextensive with said array for directing said vapor toward said condensing means and means for conveying said condensed liquid back to said reservoir.

2. Means for cooling a heated surface as recited in claim 1 where said condensing means is integral with the enclosure.

3. Means for cooling a heated surface as recited in claim 1, further providing that the microelectrodes are positioned in a radial array having a more closely spaced first end and a less closely spaced second end.

* * * * *